United States Patent
Vangari et al.

(10) Patent No.: US 12,008,884 B2
(45) Date of Patent: Jun. 11, 2024

(54) STATUS INDICATORS, SYSTEMS, AND METHODS FOR CAPACITORS

(71) Applicant: General Electric Technology GmbH, Baden (CH)

(72) Inventors: Divya Vangari, Tampa, FL (US); Joshua Kent Nikkel, Clearwater, FL (US); Steve H. Fan, Cumming, GA (US)

(73) Assignee: GE Infrastructure Technology LLC, Greenville, SC (US)

( * ) Notice: Subject to any disclaimer, the term of this patent is extended or adjusted under 35 U.S.C. 154(b) by 101 days.

(21) Appl. No.: 17/892,546

(22) Filed: Aug. 22, 2022

(65) Prior Publication Data

US 2024/0062642 A1    Feb. 22, 2024

(51) Int. Cl.
*G08B 21/18*      (2006.01)
(52) U.S. Cl.
CPC .................. *G08B 21/185* (2013.01)
(58) Field of Classification Search
CPC ........................................ G08B 21/185
See application file for complete search history.

(56) References Cited

U.S. PATENT DOCUMENTS

| | | | | |
|---|---|---|---|---|
| 4,322,766 | A | * | 3/1982 | Becker .................... H02H 7/16 361/87 |
| 4,330,777 | A | * | 5/1982 | McDuff ................. G01R 31/64 340/661 |
| 10,254,323 | B2 | * | 4/2019 | Berkcan ............... G08B 21/182 |
| 11,085,956 | B2 | * | 8/2021 | Nagayasu .............. G01R 31/64 |
| 11,333,715 | B2 | | 5/2022 | Rinne et al. |
| 2006/0038692 | A1 | * | 2/2006 | Schnetker .............. G01R 31/40 324/519 |
| 2015/0177287 | A1 | * | 6/2015 | Baburaj ................... H02H 7/16 361/88 |

* cited by examiner

*Primary Examiner* — Travis R Hunnings
(74) *Attorney, Agent, or Firm* — Eversheds Sutherland (US) LLP

(57) ABSTRACT

A status indicator for a capacitor may include first and second indicator plates, each respectively defining a first face and a second face visually distinct from the first face. The first face of each of the first and second indicator plates is displayed during nominal operation of the capacitor. The second face of only one of the first and second indicator plates is displayed in response to a partial failure of the capacitor. The second face of each of the first and second indicator plates is displayed in response to a complete failure of the capacitor. A system may include a capacitor, and the status indicator coupled to the capacitor. A method for visually indicating a status of a capacitor may include controlling, by a controller, first and second indicator plates to display selected faces indicating nominal operation, partial failure, or complete failure of the capacitor.

20 Claims, 4 Drawing Sheets

STATUS INDICATORS, SYSTEMS, AND METHODS FOR CAPACITORS

TECHNICAL FIELD

The present disclosure relates to capacitors, and in particular, to status indicators, systems, and methods for capacitors.

BACKGROUND

A capacitor bank may include a number of capacitors. One or more capacitor units of the capacitor bank may exhibit a deviation from nominal performance, partial failure, or complete failure over time. Detecting deviation or failure of particular capacitor(s) of the entire bank may require exhaustive testing of each capacitor unit of the bank. Such inspection or testing may not only require specialized equipment and additional labor, but may also require the bank or the system using the bank to be shut down during inspection. Further, the laborious testing may also discourage routine inspections.

Certain systems may provide capacitor monitoring using wired or wireless connections to detectors. However, such systems may require deploying an internet connection and associated infrastructure, and may also require an external power source.

Because each capacitor in a bank, for example, a high voltage bank, may be relatively inexpensive, users may not favor monitoring that requires additional power or connectivity.

SUMMARY

The present disclosure relates to capacitors, and in particular, to status indicators, systems, and methods for capacitors.

In embodiments, the present disclosure describes a status indicator for a capacitor. The status indicator may include first and second indicator plates. Each indicator plate defines a first face and a second face visually distinct from the first face. The status indicator is configured to display the first face of each of the first and second indicator plates during nominal operation of the capacitor. The status indicator is configured to display the second face of only one of the first and second indicator plates in response to a partial failure of the capacitor. The status indicator is configured to display the second face of each of the first and second indicator plates in response to a complete failure of the capacitor.

In embodiments, the present disclosure describes a system including a capacitor, and a status indicator coupled to the capacitor. The status indicator may include first and second indicator plates. Each indicator plate defines a first face and a second face visually distinct from the first face. The status indicator is configured to display the first face of each of the first and second indicator plates during nominal operation of the capacitor. The status indicator is configured to display the second face of only one of the first and second indicator plates in response to a partial failure of the capacitor. The status indicator is configured to display the second face of each of the first and second indicator plates in response to a complete failure of the capacitor.

In embodiments, the present disclosure describes a method for visually indicating a status of a capacitor. The method may include controlling, by a controller, first and second indicator plates to each display a first face during nominal operation of the capacitor. The method may further include controlling, by the controller, in response to a partial failure of the capacitor, the first and second indicator plates to display a second face of only one of the first and second indicator plates. The method may further include controlling, by the controller, in response to a complete failure of the capacitor, the first and second indicator plates to each display the second face. The second face is visually distinct from the first face of each of the first and indicator plates.

Additional systems, methods, apparatus, features, and aspects can be realized through the techniques of various embodiments of the disclosure. Other embodiments and aspects of the disclosure are described in detail herein and are considered a part of the claimed subject matter. Other features can be understood and will become apparent with reference to the description and to the drawings.

BRIEF DESCRIPTION OF THE DRAWINGS

Having thus described the disclosure in general terms, reference will now be made to the accompanying drawings, which are not necessarily drawn to scale.

Figure 1:
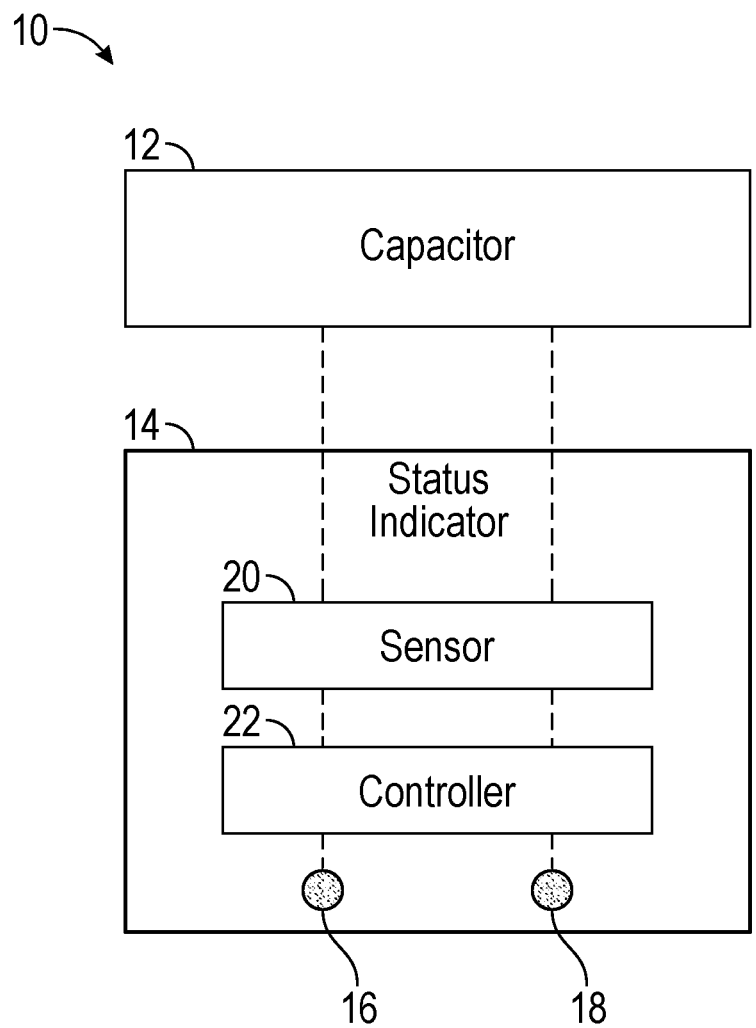

FIG. 1 is a block diagram showing a system including a capacitor coupled to a status indicator including first and second indicator plates.

Figure 2A:
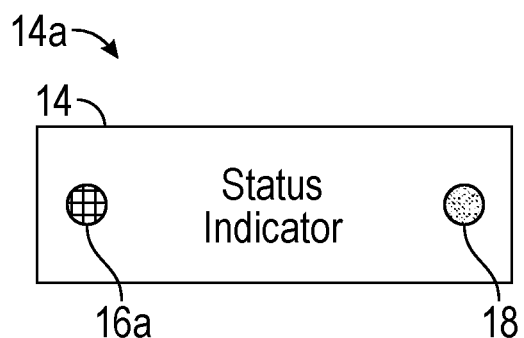

FIG. 2A is a block diagram showing the status indicator of FIG. 1 in a first configuration indicating a partial failure of the capacitor.

Figure 2B:
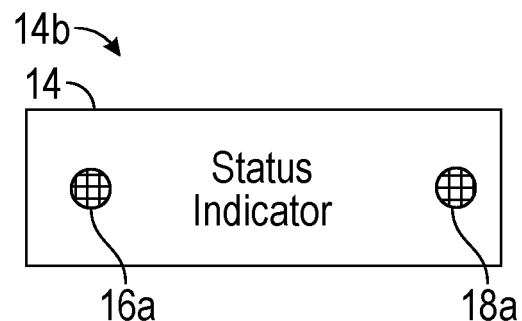

FIG. 2B is a block diagram showing the status indicator of FIG. 1 in a first configuration indicating a complete failure of the capacitor.

Figure 3A:
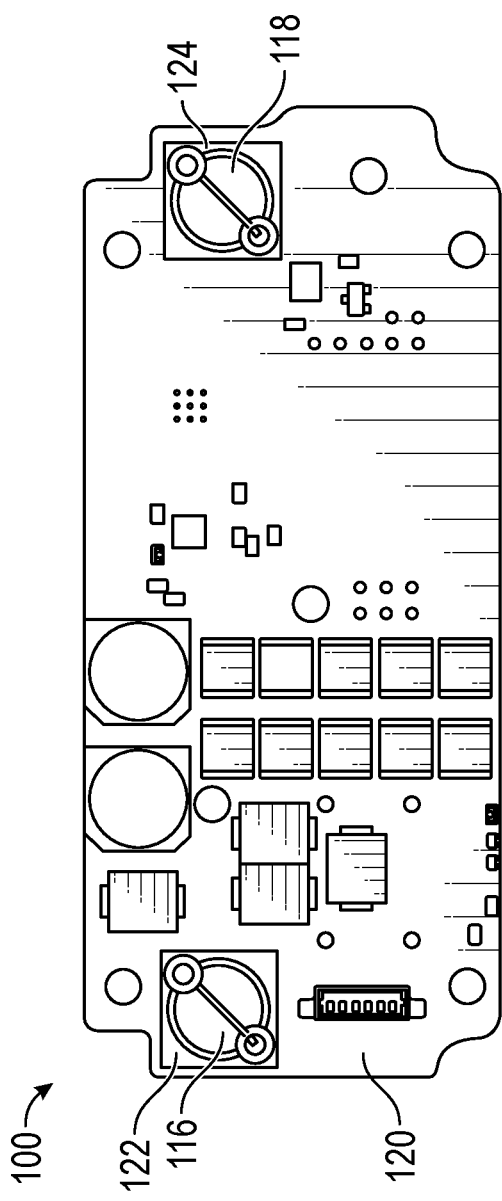

FIG. 3A is a top view of a system including a circuit board including first and second flip dot indicators.

Figure 3B:
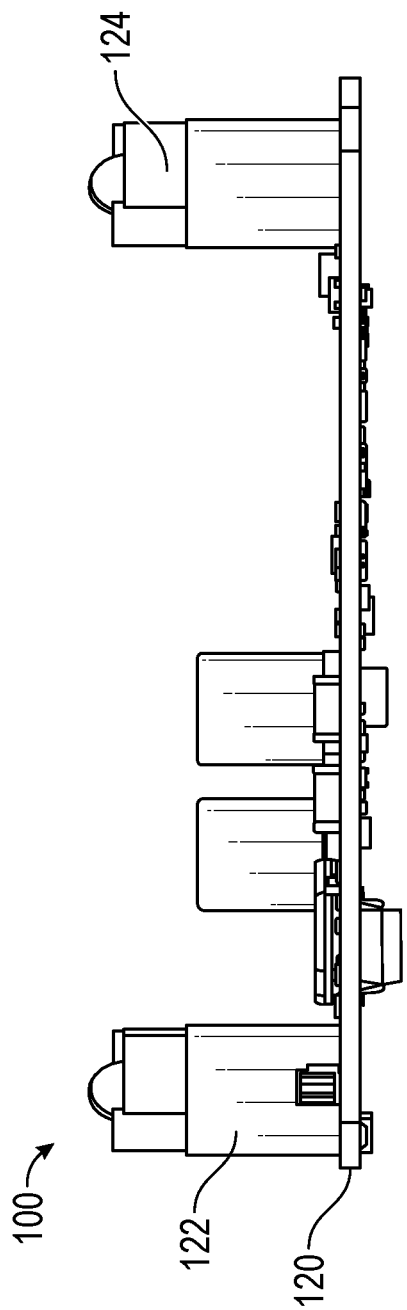

FIG. 3B is a side view of the system of FIG. 3A.

Figure 4:
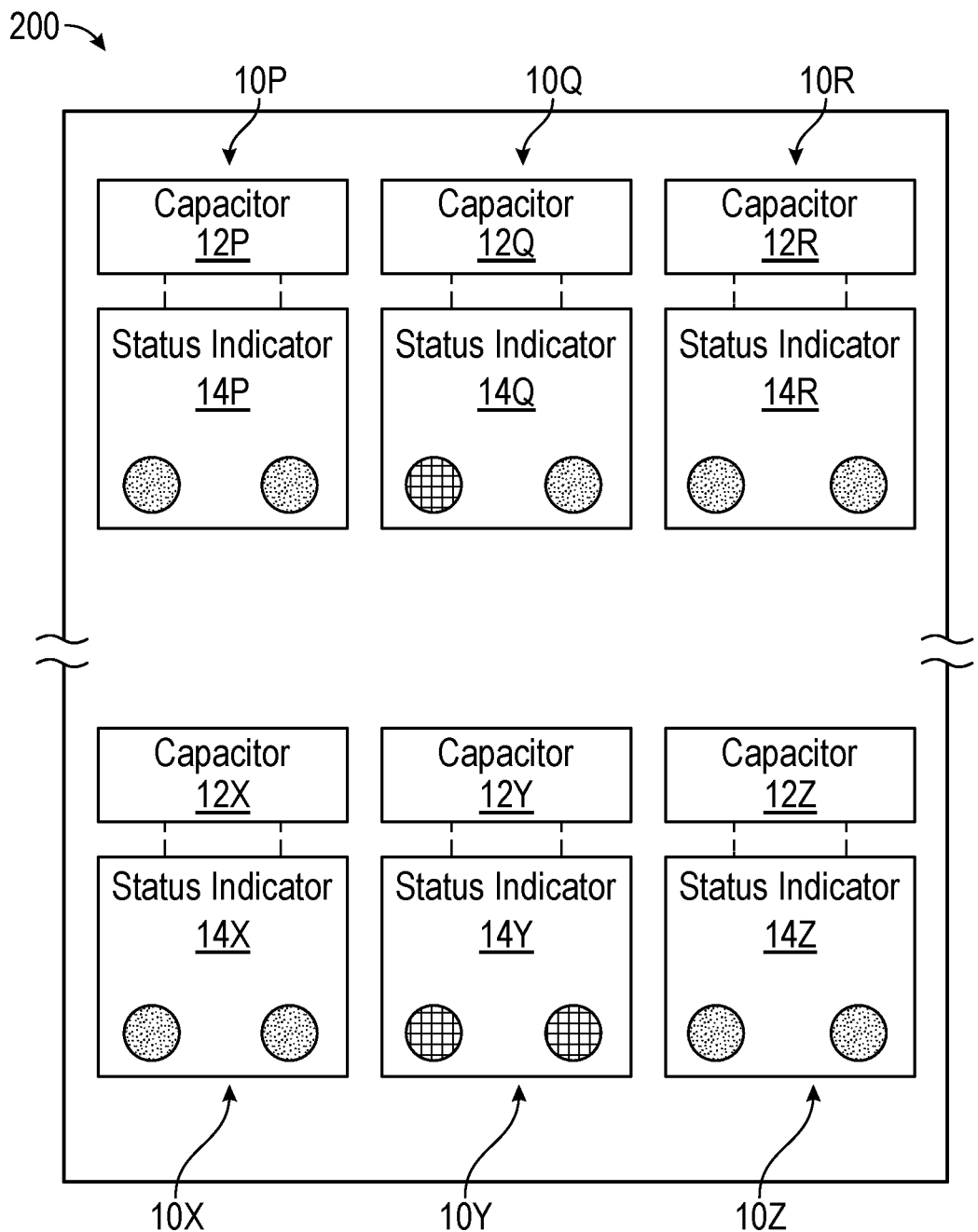

FIG. 4 is a block diagram showing a system including a capacitor bank including capacitors connected to respective status indicators.

Figure 5:
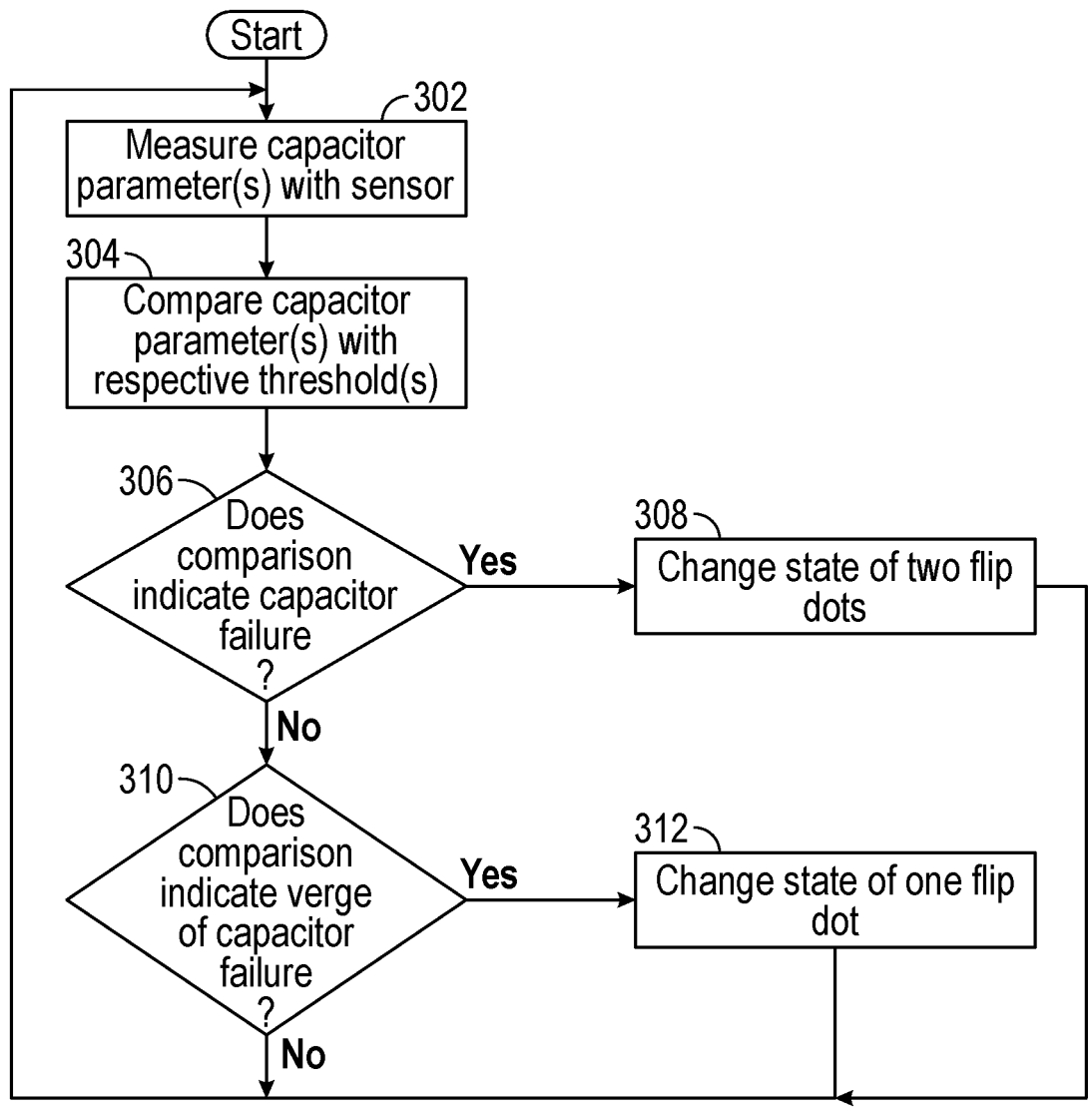

FIG. 5 is a flow diagram representing a method for visually indicating the status of a capacitor.

Embodiments of the disclosure are described more fully below with reference to the accompanying drawings, in which example embodiments of the disclosure are shown. This disclosure may, however, be embodied in many different forms and should not be construed as limited to the example embodiments set forth herein; rather, these embodiments are provided so that this disclosure will be thorough and complete, and will fully convey the scope of the present disclosure to those skilled in the art. Like numbers refer to like, but not necessarily the same or identical, elements throughout.

The following embodiments are described in sufficient detail to enable at least those skilled in the art to understand and use the disclosure. It is to be understood that other embodiments would be evident based on the present disclosure and that process, mechanical, material, dimensional, process equipment, and parametric changes may be made without departing from the scope of the present disclosure.

In the following description, numerous specific details are given to provide a thorough understanding of various embodiments of the present disclosure. However, it will be apparent that the present disclosure may be practiced without these specific details. In order to avoid obscuring the present disclosure, some well-known system configurations and process steps may not be disclosed in full detail. Likewise, the drawings showing embodiments of the disclosure are semi-diagrammatic and not to scale and, particularly, some of the dimensions are for the clarity of presentation and may be exaggerated in the drawings. In addition, where multiple embodiments are disclosed and described as having some features in common, for clarity and ease of illustration, description, and comprehension thereof, similar and like features will ordinarily be described with like reference numerals even if the features are not identical

DETAILED DESCRIPTION

The present disclosure relates to capacitors, and in particular, to status indicators, systems, and methods for capacitors. Status indicators according to the present disclosure may be used to visually ascertain the status (operational, partial failure, or complete failure) of a capacitor. In embodiments, status indicators may use mechanical indicators which may not require continuous power to maintain a current indicated status, and which may require low power to change status. The status indicators may be useful not only for failure detection, but also for predictive maintenance.

Certain systems for monitoring capacitor banks may only be able to detect or indicate failure of the bank as a whole, but may not be able to detect or indicate particular capacitors of the bank that have failed. Status indicators according to the present disclosure may be used to detect and indicate status of individual capacitors in a bank.

When a capacitor failure occurs, the status indicators may be used to quickly visually identify the location of one or more failed capacitors. Such a visual identification may save users, for example, utility companies, considerable time by avoiding the need to inspect or measure individual capacitors.

In embodiments, a status indicator for a capacitor may include first and second indicator plates, each defining a first face and a second face visually distinct from the first face. The status indicator is configured to exhibit different combinations of the faces for the first and second indicators to display capacitor status. For example, the first face of each of the first and second indicator plates is displayed during nominal operation of the capacitor. In response to detecting partial or complete failure, the status indicator may change the face of one or both of the first and second indicator plates.

For example, the second face of only one of the first and second indicator plates may be displayed in response to a partial failure of the capacitor. The second face of each of the first and second indicator plates is displayed in response to a complete failure of the capacitor. Thus, a visual inspection of the status indicator may be sufficient to detect a current status. For example, both plates may show a black-colored face to indicate normal operational status, while a single plate may show a yellow-colored face to indicate partial failure or verge of failure, and both plates may show a yellow-colored face to indicate complete failure and need of replacement.

In embodiments, the status indicator may include electronic displays, instead of, or in addition to, the indicator plates. For example, the status indicator may include first and second electronic displays, each electronic display being configured to display a first indication and a second indication visually distinct from the first indication. The status indicator may be configured to display the first indication of each of the first and second electronic displays during nominal operation of the capacitor. The status indicator may be configured to display the second indication of only one of the first and second electronic displays in response to a partial failure of the capacitor. The status indicator may be configured to display the second indication of each of the first and second electronic displays in response to a complete failure of the capacitor. The electronic displays may include light emitting diodes (LEDs), e-ink displays, liquid crystal displays, or any suitable displays that can display first and second indications. For example, the status indicator may include a first LED and a second LED, the first indication may be a non-illuminated state, and the second indication may be an illuminated state. In embodiments, the status indicator may include a single electronic display configured to indicate multiple indications. For example, the single electronic display may display a first indication indicative of nominal operation, a second indication indicative of partial failure, and a third indication indicative of complete failure. The indications may include a static or dynamic display of one or more colors, patterns, images, or alphanumeric symbols or text.

In embodiments, the status indicator may include more than two indicator plates or electronic displays. For example, the status indicator may include three, four, or more indicator plates or electronic displays, and the status indicator may be configured to indicate one of a plurality of operational or failure states.

In embodiments, a system may include a capacitor, and the status indicator coupled to the capacitor. In embodiments, a method for visually indicating a status of a capacitor may include controlling, by a controller, first and second indicator plates to display selected faces indicating nominal operation, partial failure, or complete failure of the capacitor. Such systems and methods may be used for predictive maintenance using standalone indicators, which may not require external power or internet connectivity for operation.

In embodiments, a capacitor bank may include two or more capacitors, with each capacitor coupled to a respective status indicator. In this way, a quick visual inspection of the entire bank may be used to distinguish operational capacitors from partially or completely failed capacitors. Such a visual inspection may be considerably less labor intensive in comparison to performing a manual electronic test of each capacitor.

Further, even in case of power failure, status indicators according to the present disclosure may continue to show the last detected status of the capacitor, and the face may remain visually detectable even without power. Thus, unlike typical predictive maintenance, a user will no longer need to install data connectivity or dashboards for determining verge of failure and assist in predictive maintenance. Wireless or wired connectivity is optional.

For example, two electromechanical indicators may be provided on a sensor at opposite ends of a PCB, and may be visible through a window. The indicators may include flip dots, which may initially show one color or pattern, and flip to another color or pattern in response to failure. For example, only a single one indicator may flip in response to a single section shorted in the capacitor, which is an indication for verge of failure and allows for predictive maintenance. Both indicators may flip in response to complete failure (for example, all sections shorted), indicating a need to replace the capacitor.

Indicators and systems according to the present disclosure may use one or both of a sensor or a controller. For example, a sensor may sample parameters such as voltage or current, and compute impedance values to determine failure or verge of failure in a capacitor. In embodiments, detection of shorting of one capacitive section may be indicative of verge of failure, but with the individual capacitor still continuing to perform. In such a case, a utility can plan for an outage in order to replace the capacitor in due course. All sections (for example, both sections of a dual section capacitor) shorting may be considered as complete failure, where there is a possibility for the entire bank to trip, which may result in an unplanned outage and immediate need for replacing one or more failed capacitor.

Different statuses such as "failure," "partial failure," "verge of failure," or "complete failure" may be customized or set based on a predetermined standard according to a particular user. For example, a capacitor may include a number of sections, and a standard may reference shorting of two of those sections as verge of failure, more than three sections to be complete. Thus, various modes of failure can be indicated by the present indicators, systems, and methods. For example, an electromechanical display such as a flip dot display may be used. In embodiments, two flip dots may be used, with one flip dot turning or flipping to yellow (from an initial black display) for predictive maintenance, and remaining in that state until being reset. Both flip dots may turn or flip to yellow when two series sections fail, indicating a complete failure mode. Again, both flip dots will remain in the same state until they are reset, or until the indicator is mounted onto a replacement or another capacitor and re-configured. Further, the status does not change even when the bank trips off, or otherwise loses power. Yellow or another suitable color (or pattern) may be used to represent a warning sign that is clearly visible, so that a user can determine an appropriate course of action.

In some embodiments, a controller may receive signals from the sensor indicative of one or more parameters and compute impedance values of a capacitor. The controller may compare predetermined threshold values or nominal ranges with computed values, and determine extent of deviation from the threshold values or nominal ranges.

FIG. 1 is a block diagram showing a system 10 including a capacitor 12 coupled to a status indicator 14 including first and second indicator plates 16 and 18. The status indicator 14 may visually indicate an operational status of the capacitor 12.

The status indicator 14 may include a housing for shielding one or more components of the status indicator 14 from an external environment. The housing of the status indicator 14 may be formed of any suitable material, for example, a metal, an alloy, a plastic, a ceramic, a composite, or combinations thereof. The housing may be water or moisture resistant, or waterproof to a predetermined degree. The status indicator 14 may be coupled to the capacitor 12 at a lid, a side, or a bottom of the capacitor 12.

Each indicator plate of the first and second plates 18 may define a first face and a second face visually distinct from the first face. The combination of faces visible at both plates 16 and 18 may indicate a status of the capacitor 12. For example, the status indicator 14 is configured to display the first face of each of the first and second indicator plates 16 and 18 during nominal operation of the capacitor 12.

The status indicator 14 is configured to display the second face of each of the first and second indicator plates 16 and 18 in response to a complete failure of the capacitor 12. The first face may display one or more of a color, a pattern, an image, a texture, or a reflectivity and wherein the second face differs from the first face in at least one of color, pattern, image, texture, or reflectivity. In some embodiments, the pattern may include an alphanumeric symbol or text. Each indicator plate 16 and 18 may be configured to retain the displayed first face or second face in response to a power loss.

A partial failure of the capacitor may include shorting of less than all capacitive sections of the capacitor, and a complete failure may include shorting of all capacitive sections of the capacitor. In embodiments, the capacitor 12 includes or consists of first and second capacitive sections. In some such embodiments, the first indicator plate 16 is configured to indicate a status of the first capacitive section, and the second indicator plate 18 is configured to indicate a status of the second capacitive section.

In the example shown in FIG. 1, each of the first and second indicator plates 16 and 18 shows the first face (represented by a black-colored face).

FIG. 2A is a block diagram showing the status indicator 14 of FIG. 1 in a first configuration 14a indicating a partial failure of the capacitor 12. The status indicator 14 is configured to display the second face of only one of the first and second indicator plates 16 and 18 in response to a partial failure of the capacitor 12. For example, only one of indicator plates 16 or 18 shows a second face (for example, shown as a yellow-colored face). In the example shown in FIG. 2A, the first indicator plate 16 shows the second face in a configuration 16a, while the second indicator plate 18 shows the first face.

FIG. 2B is a block diagram showing the status indicator 14 of FIG. 1 in a second configuration 14b indicating a complete failure of the capacitor 12. For example, both the first and second indicator plates 16 and 18 are in second configurations 16a and 18a, showing the second faces (for example, both showing a yellow-colored face).

Thus, a user may visually discern whether each of the first and second plates 16 or 18 is displaying the first face or the second face. The faces may extend across parts of or along entire surfaces of the plates 16 or 18. The faces may be distinguishable under different ambient conditions, for example, in daylight, dusk, dawn, twilight, moonlight, or low light conditions. In some embodiments, the faces may be distinguishable in response to an external light, for example, a lamp, a flash light, or an ultraviolet or "black light." In some embodiments, the faces or portions thereof may be reflective. In some such embodiments, the faces or portions thereof may be retroreflective. In some embodiments, the faces may be distinguishable at different viewing angles and orientations.

In embodiments, the first face displays a solid black color, and the second face displays a solid yellow color. Thus, if both indicator plates exhibit a black color, normal operation may be assumed, while the presence of a yellow-colored face in one or both indicator plates indicates a capacitor failure.

The indicator plates 16 and 18 may be formed of paper, metal, alloy, plastic, ceramic, or any suitable substrate. In some embodiments, the indicator plates 16 and 18 are identical in size and shape. In other embodiments, the indicator plates 16 and 18 may differ in size or shape. The indicator plates 16 and 18 may have any suitable shape, for example, a disc, an ellipsoid, a curved shape, a square, a rectangle, a polygon, or some other shape. In embodiments, the first and second indicator plates 16 and 18 may be independently circular, ellipsoidal, or polygonal.

The plates 16 and 18 may flip 180° front-to-back to show different faces. For example, a front face may be the first face and a back face may be the second face.

The first and second indicator plates 16 and 18 may be provided in suitable housings, for example, both in the same housing, for compactness. The housing may be formed of any suitable rigid material, for example, metal, alloy, or plastic. The housing may include a window to display a face.

The window may be covered by a sheet, for example, a transparent or translucent sheet. The sheet may be formed of glass or plastic. The plastic may include acrylic.

In embodiments, the first indicator plate 16 is housed in a first indicator housing, and the second indicator plate 18 is housed in a second indicator housing spaced from the first indicator housing. Thus, the first and second indicator plates 16 and 18 may ultimately be spaced from each other. Such spacing may promote reading of the status of each of plates 16 and 18 from a distance from the status indicator 14.

In embodiments, the first and second indicator plates 16 and 18 may include a motor, an electromagnetic element, or some motive element configured to show either the first face or the second face. For example, each plate may flip between (toggle between) the first and second faces in response to a signal. In other examples, each plate may display a first face in response to a first signal, and a second face in response to a second signal.

In embodiments, the first and second indicator plates may be plates of respective flip dots.

FIG. 3A is a top view of a system 100 including a circuit board 120 including first and second flip dots 122 and 124. FIG. 3B is a side view of the system 100 of FIG. 3A. The first flip dot 122 may include a first indicator plate 116, and the second flip dot may include a second indicator plate 118. The circuit board 120 may support a sensor and a controller. For example, the sensor may detect one or more parameters of a capacitor, while the controller may control the status of the flip dot indicators 122 and 124 in response to the detected parameters. In embodiments, the circuit board 120 does not include a separate power source, and may draw power from the capacitor itself. Even in case of capacitor or power failure, the flip dot indicators 122 and 124 will continue to hold their last status.

Turning back to FIG. 1, the status indicator 14 may include a sensor 20 configured to measure at least one operational parameter of the capacitor 12 and generate at least one signal indicative of the at least one operational parameter. The at least one operational parameter may include one or more of a voltage, a current, a capacitance, an impedance, or any other electrical parameter.

In embodiments, the status indicator 14 may further include a controller 22. The controller 22 may be distinct from the sensor 20, or may itself function as the sensor 20. In embodiments, the controller 22 is configured to receive the signal indicative of the at least one operational parameter (for example, from the sensor 20 or from the capacitor 12). The controller 22 may be further configured to compare the at least one operational parameter of the capacitor with a nominal threshold parameter value or a nominal parameter range. The controller 22 may be further configured to trigger a change of display of at least one of the first and second indicator plates 16 and 18 in response to detecting a deviation of the at least one operational parameter of the capacitor 12 beyond the nominal threshold parameter value or the nominal parameter range.

In embodiments, the controller 22 is further configured to reset each of the first and second indicator plates 16 and 18 to display the first face in response to a reset signal. The reset signal may be received from a reset button, or from a reset line.

While controller 22 may indicate the status of the capacitor 12 solely visually via the indicator plates 16 and 18, in some embodiments, the controller 22 may also be configured to generate and communicate a signal indicative of the status. For example, in addition to the visual status, the controller 22 may send a signal over a wired or wireless connection indicative of the status of the capacitor 12. The signal may be received by another system or a user, and appropriate action may be taken in response to the status.

In embodiments, the status indicator 14 as a whole, or one or more components of status indicator 14, for example, the indicator plates 16 or 18, the sensor 20, or the controller 22, is configured to operate on electric power drawn from the capacitor 12.

While FIG. 1 illustrates a single status indicator associated with a single capacitor 12, status indicators may be used with two or more of capacitors.

FIG. 4 is a block diagram showing a system 200 including a capacitor bank including capacitors 12P to 12Z connected to respective status indicators 14P to 14Z. The combinations of capacitor and status indicator respectively constitute systems 10P to 10Z, each operating similar to system 10 described with reference to FIGS. 1 to 2A. Thus, one of the systems 10P to 10Z may be considered to be the system 10 of FIG. 1, and others of the systems 10P to 10Z may be considered to be essentially similar. In the system 200, each status indicator 14P to 14Z is coupled to a respective capacitor 12P to 12Z.

A user may visually ascertain at a single inspection the status of each capacitor of the capacitors 12P to 12Z. For example, in the example shown in FIG. 4, capacitor 12Q has a partial failure, while capacitor 12Y has complete failure. Thus, the user may not need to test each of the other capacitors individually, and can replace only those capacitors that need maintenance.

FIG. 5 is a flow diagram representing a method for visually indicating the status of a capacitor. The flow diagram of FIG. 5 is described with reference to the system 10 of FIG. 1 for convenience. However, the method may be implemented using any status indicator or system according to the present disclosure.

The method may include controlling, by the controller 22, first and second indicator plates 16 and 18 to each display the first face during nominal operation of the capacitor 12.

The method may further include measuring, by the sensor 20, at least one operational parameter of the capacitor 12 and generating at least one signal indicative of the at least one operational parameter (302). The method may further include receiving, by the controller 22, the signal indicative of the at least one operational parameter from the sensor 20.

The method may further include comparing, by the controller 22, the at least one operational parameter of the capacitor 12 with a nominal threshold parameter value or a nominal parameter range (304). In some embodiments, the method includes triggering, by the controller 22, a change of display of at least one of the first and second indicator plates 16 and 18 in response to detecting a deviation of the at least one operational parameter of the capacitor beyond the nominal threshold parameter value or the nominal parameter range.

The method may further include controlling, by the controller 22, in response to a comparison (306) indicating partial failure of the capacitor, the first and second indicator plates to display the second face of only one of the first and second indicator plates (308).

The method may further include controlling, by the controller 22, in response to a comparison (310) indicating complete failure of the capacitor 12, the first and second indicator plates to each display the second face (312). The second face is visually distinct from the first face of each of the first and indicator plates.

Thus, the present disclosure provides status indicators, systems, and methods for detecting the operational status of one or more capacitors.

That which is claimed is:

1. A status indicator for a capacitor, the status indicator comprising:
   first and second indicator plates, each indicator plate defining a first face and a second face visually distinct from the first face,
   wherein the status indicator is configured to display the first face of each of the first and second indicator plates during nominal operation of the capacitor,
   wherein the status indicator is configured to display the second face of only one of the first and second indicator plates in response to a partial failure of the capacitor, and
   wherein the status indicator is configured to display the second face of each of the first and second indicator plates in response to a complete failure of the capacitor.

2. The status indicator of claim 1, wherein each indicator plate is configured to retain the displayed first face or second face in response to a power loss.

3. The status indicator of claim 1, wherein the partial failure of the capacitor comprises shorting of less than all capacitive sections of the capacitor, and wherein the complete failure comprises shorting of all capacitive sections of the capacitor.

4. The status indicator of claim 1, wherein the capacitor comprises first and second capacitive sections, wherein the first indicator plates is configured to indicate a status of the first capacitive section, and wherein the second indicator plate is configured to indicate a status of the second capacitive section.

5. The status indicator of claim 1, wherein the first face displays one or more of a color, pattern, texture, or reflectivity and wherein the second face differs from the first face in at least one of the color, pattern, texture, or reflectivity.

6. The status indicator of claim 1, wherein the first face displays a solid black color, and wherein the second face displays a solid yellow color.

7. The status indicator of claim 1, wherein the first indicator plate is housed in a first indicator housing, and wherein the second indicator plate is housed in a second indicator housing spaced from the first indicator housing.

8. The status indicator of claim 1, further comprising a first flip dot comprising the first indicator plate and a second flip dot comprising the second indicator plate.

9. The status indicator of claim 1, wherein the first and second indicator plates are independently circular, ellipsoidal, or polygonal.

10. The status indicator of claim 1, further comprising a sensor configured to measure at least one operational parameter of the capacitor and generate at least one signal indicative of the at least one operational parameter.

11. The status indicator of claim 10, further comprising a controller configured to:
    receive the signal indicative of the at least one operational parameter from the sensor;
    compare the at least one operational parameter of the capacitor with a nominal threshold parameter value or a nominal parameter range; and
    trigger a change of display of at least one of the first and second indicator plates in response to detecting a deviation of the at least one operational parameter of the capacitor beyond the nominal threshold parameter value or the nominal parameter range.

12. The status indicator of claim 11, wherein the controller is further configured to reset each of the first and second indicator plates to display the first face in response to a reset signal.

13. The status indicator of claim 1, wherein the status indicator is configured to operate on electric power drawn from the capacitor.

14. A system comprising:
    a capacitor; and
    a status indicator coupled to the capacitor,
    wherein the status indicator comprises first and second indicator plates, each indicator plate defining a first face and a second face visually distinct from the first face,
    wherein the status indicator is configured to display the first face of each of the first and second indicator plates during nominal operation of the capacitor,
    wherein the status indicator is configured to display the second face of only one of the first and second indicator plates in response to a partial failure of the capacitor, and
    wherein the status indicator is configured to display the second face of each of the first and second indicator plates in response to a complete failure of the capacitor.

15. The system of claim 14, wherein the status indicator is configured to operate on electric power drawn from the capacitor.

16. The system of claim 14, wherein the status indicator is coupled to the capacitor at a lid, a side, or a bottom of the capacitor.

17. The system of claim 14, comprising a plurality of capacitors comprising the capacitor, and a plurality of status indicators comprising the status indicator, wherein each status indicator of the plurality of status indicators is coupled to a respective capacitor of the plurality of capacitors.

18. A method for visually indicating a status of a capacitor, the method comprising:
    controlling, by a controller, first and second indicator plates to each display a first face during nominal operation of the capacitor;
    controlling, by the controller, in response to a partial failure of the capacitor, the first and second indicator plates to each display a second face of only one of the first and second indicator plates; and
    controlling, by the controller, in response to a complete failure of the capacitor, the first and second indicator plates to each display the second face,
    wherein the second face is visually distinct from the first face for each of the first and indicator plates.

19. The method of claim 18, further comprising measuring, by a sensor, at least one operational parameter of the capacitor and generating at least one signal indicative of the at least one operational parameter.

20. The method of claim 19, further comprising:
    receiving, by the controller, the signal indicative of the at least one operational parameter from the sensor;
    comparing, by the controller, the at least one operational parameter of the capacitor with a nominal threshold parameter value or a nominal parameter range; and
    triggering, by the controller, a change of display of at least one of the first and second indicator plates in response to detecting a deviation of the at least one operational parameter of the capacitor beyond the nominal threshold parameter value or the nominal parameter range.

* * * * *